United States Patent [19]

Ikeda

[11] Patent Number: 5,250,842
[45] Date of Patent: Oct. 5, 1993

[54] SEMICONDUCTOR DEVICES USING TAB TAPE

[75] Inventor: Yukihito Ikeda, Tokyo, Japan
[73] Assignee: NEC Corporation, Japan
[21] Appl. No.: 755,541
[22] Filed: Sep. 5, 1991

[30] Foreign Application Priority Data

Sep. 7, 1990 [JP] Japan .................. 2-94403[U]

[51] Int. Cl.⁵ .................. H01L 23/48; H01L 23/28
[52] U.S. Cl. ........................ 257/668; 257/669;
257/671; 257/676
[58] Field of Search ............... 357/70, 72, 80;
257/668, 669, 671, 676

[56] References Cited

U.S. PATENT DOCUMENTS

| | | | |
|---|---|---|---|
| 4,280,132 | 7/1981 | Hayakawa et al. | 357/70 |
| 4,994,895 | 8/1991 | Matsuzaki et al. | 357/70 |
| 5,031,022 | 7/1991 | Yamamoto et al. | 357/70 |
| 5,070,039 | 12/1991 | Johnson et al. | 357/70 |

Primary Examiner—Eugene R. LaRoche
Assistant Examiner—Viet Q. Nguyen
Attorney, Agent, or Firm—Laff, Whitesel, Conte & Saret

[57] ABSTRACT

In a tape automated bonding (TAB) tape used in a semiconductor device, there is provided at each of the corners of a square opening therein a projection inwards the opening instead of the conventional right angle corner. This projection is left when said opening is cut in the base tape or when metal foil on the base tape is selectively etched. According to the present invention, gap between each corner of the opening and each corner of a semiconductor chip can be reduced in virtue of the above-mentioned projection, this permitting to prevent resin to be applied for coating a semiconductor chip and the inner leads to be bonded to it from dripping through the corner.

10 Claims, 2 Drawing Sheets

SEMICONDUCTOR DEVICES USING TAB TAPE

BACKGROUND OF THE INVENTION

This invention relates to semiconductor devices manufactured by using a TAB tape, and more particularly to an improvement of the TAB tape.

A tape for TAB (Acronym for Tape Automated Bonding) is made by in sequence cutting from a base tape of plastic a rectangular or square opening, as a device hole, somewhat larger than a semiconductor chip to be mounted, putting copper foil over this plastic tape, and then etching this copper foil to form a lead pattern (Ref. Japanese Patent Laid-Open Application No. Sho. 58-15252). Inner leads project as if they were fingers inwards the device hole, and their end portions are bonded, accordingly connected, to bumps on a semiconductor chip placed in the device hole.

In general, the above-mentioned device hole in such TAB tape measures to receive the semiconductor chip therein with a gap of 0.5 to 1.5 mm. In the process of manufacturing semiconductor devices by using such a TAB tape, usually for the purpose of holding the reliability, coating with a resin such as an epoxy resin, following the above bonding step, is performed over the semiconductor chip and the projected portions of the inner leads inwards the device hole to form the resin coating on them for the protection of their surfaces (Ref. Nikkei Electronics No. 506 (Aug. 6, 1990) p. 113). After forming the protective resin coating, the TAB tape is wound on a reel, which then is set in an outer lead bonding apparatus. After bonding there, the outer leads are cut at their appropriate positions from the base tape, and bonded to a package, a printed circuit board or the like. Thus a semiconductor device is made up.

In the formation of the above-mentioned resin coating using the above-mentioned TAB tape, a part of the resin trends to drip through gap between the device hole edges and the semiconductor chip particularly at the corners of the device hole because of relatively large gap thereat. It, therefore, is difficult to form uniformly the above-mentioned resin coating. This brings an important problem particularly when a low viscosity resin is used as the coating material.

BRIEF SUMMARY OF THE INVENTION

It is an object of the present invention to provide a semiconductor device manufactured by using a TAB tape permitting the above-mentioned resin coating to be formed uniformly even by using a low viscosity resin as the coating material.

According to the invention, there is provided a semiconductor device using a TAB tape which is constructed such that there are provided a device hole in a base tape for installing a semiconductor chip, a plurality of lead fingers affixed to the base tape and projected in the device hole to be connected to the semiconductor chip, and projections inwards, and at the corners of, the device hole. The projections may be made of the base tape material or overhangs of the copper foil material put on the base tape.

Accordingly, the above-mentioned projection of the present invention in each corner of the device hole overlaps a corner of the semiconductor chip to reduce the above-mentioned gap. The problem of the coating material dripping during resin coating step can be solved.

BRIEF DESCRIPTION OF THE DRAWINGS

The above-mentioned and other objects, features and advantages of this invention will become more apparently by reference to the following detailed description of the invention taken in conjunction with accompanying drawings, wherein.

DETAILED DESCRIPTION OF THE PREFERRED EMBODIMENTS

Figure 1A:
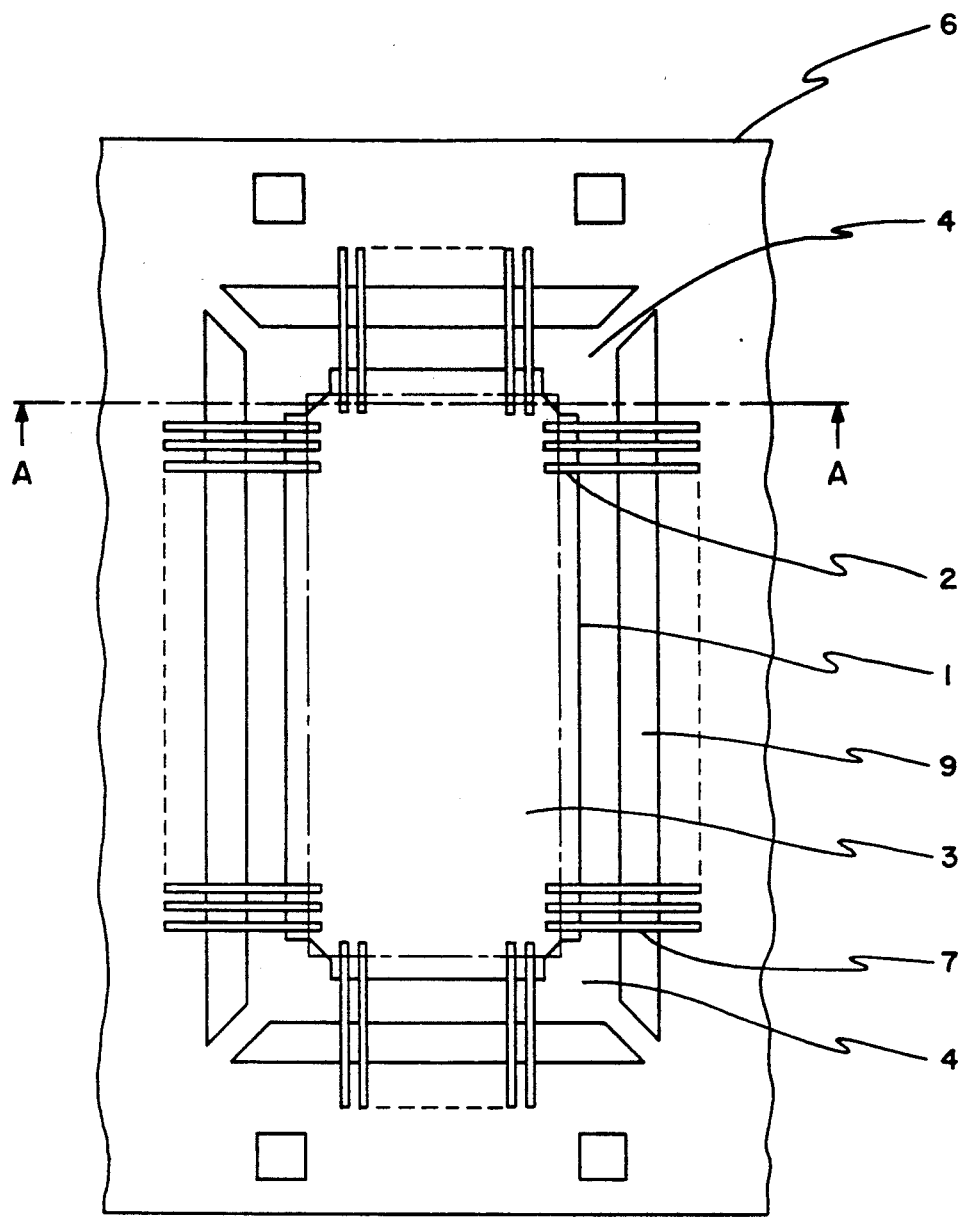
FIG. 1(a) is a fragmentary plan view of an embodiment of the present invention.
Figure 1B:
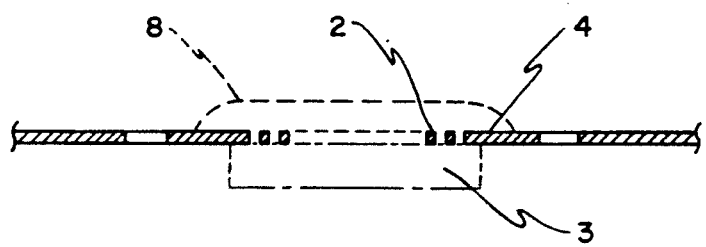
FIG. 1(b) is a cross-sectional view along line A—A of FIG. 1(a)

Referring to FIGS. 1(a) and 1(b), a TAB tape using in a first embodiment of the present invention will be described. There is provided at each of four corners of a device hole 1 in the TAB tape 6 a projection 4 of polyimide resin from the base tape of the same resin, which remains left when hole 1 is cut from the base tape to leave these projections 4. The cut base tape is covered with copper foil which then is etched away, leaving a plurality of inner leads 2 projecting, as if they were fingers, inwards the device hole 1. The inner leads 2 are bonded at their end portions to the gold bumps (not shown) on the semiconductor chip 3 (shown by a dash-and-dot line in FIG. 1(a)) as shown in FIG. 1(b). Then the portions of the inner leads 2 projecting inwards the device hole 1 and the surface of the chip 3 are coated with an epoxy resin 8. Subsequently, the outer leads 7 are cut at the outer apertures 9 to separate from the tape 6, and mounted in a package or on a printed circuit board.

Figure 2:
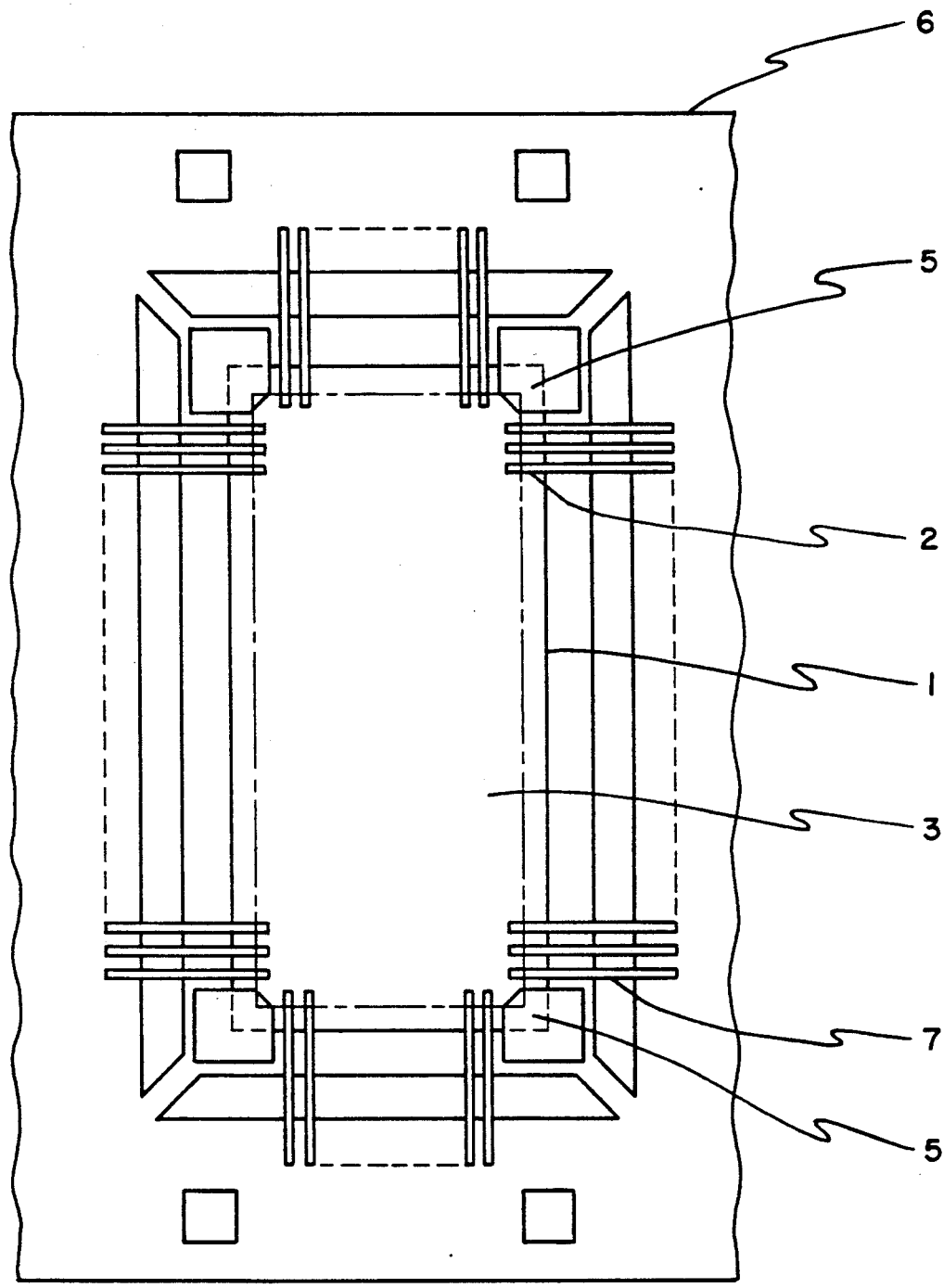
FIG. 2 is a fragmentary plan view of a second embodiment of the present invention.

In the second embodiment of the present invention illustrated in FIG. 2, there is provided at each of four corners of a device hole 1 an overhang 5 of copper foil material affixed on the TAB tape 6. These overhangs 5 together with inner leads 2 remain left after the etching. The process except this point is the same as in the first embodiment above-described and hence description of it is omitted. In this embodiment, each overhang 5 extends to a position where it overlap a corner of the semiconductor chip 3, with an result of obstructing the gap and accordingly of preventing coating material from dripping therethrough. Further advantage of this embodiment is that etching can form the overhangs 5 of selected dimensions with easiness, which permits to cope flexibly with mounting semiconductor chips of various dimensions.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor device comprising: a semiconductor chip having a first quadrilateral shape with four corners; a tape carrier including a base tape made of a thin insulating material strip and having an upper surface, said base tape having a device hole formed therein with a second quadrilateral shape having four corner portions of said base tape forming projections extending into said device hole, said second quadrilateral shape being larger than said first quadrilateral shape of said semiconductor chip and said four projections extending far enough into said hole to, respectively, support said four corners of said semiconductor chip, and a plurality of inner leads made of a metal foil attached to said upper surface of said base tape, said inner leads projecting onto said device hole in order to form portions for making connections to said semiconductor chip, said semiconductor chip being electrically connected and mechanically fixed to said connecting portions of said inner leads; and a resin coating said semiconductor chip and said connecting portions of said inner leads.

2. A semiconductor device as claimed in claim 1, wherein said thin insulating material strip is made of a polyamide resin strip.

3. A semiconductor device as claimed in claim 1, wherein said metal foil is made of copper.

4. A semiconductor device as claimed in claim 1, wherein said coating resin is an epoxy resin.

5. A tape having at least one opening formed therein for receiving a semiconductor chip, said tape including at least one metal finger extending into said opening for resin bonding to said chip, said tape also including a projection extending into said opening to bridge a gap between said tape and a corner of said chip through which said resin may drip, whereby said projection resists said dripping.

6. The tape of claim 5 wherein said opening has at least one corner which may form said gap and said projection spans said corner.

7. The tape of claim 5 wherein said opening is rectangular with four corners where gaps may be formed and said projections span each of said gaps at said corners.

8. The tape of claim 5 wherein said tape includes a base of insulating material with a surface of conductive material in association therewith, said conductive material forming said at least one metal finger and said projection being formed by said insulating material.

9. The tape of claim 5 wherein said tape includes a base of insulating material with a surface of conductive material in association therewith, said conductive material forming said at least one metal finger, and said projection being formed by a combination of said insulating material and said conductive material.

10. The tape of any one of the claims 5 to 9 wherein said tape has a plurality of said openings repeated at periodic locations along the length thereof.

* * * * *